(12) United States Patent
Wagner et al.

(10) Patent No.: US 8,442,659 B2
(45) Date of Patent: May 14, 2013

(54) ROTARY ACTUATOR POSITION SENSOR

(75) Inventors: Jeffrey M. Wagner, Corvallis, OR (US);
Daniel L. Schloesser, Salem, OR (US)

(73) Assignee: MEI, LLC, Albany, OR (US)

( * ) Notice: Subject to any disclaimer, the term of this patent is extended or adjusted under 35 U.S.C. 154(b) by 520 days.

(21) Appl. No.: 12/707,591

(22) Filed: Feb. 17, 2010

(65) Prior Publication Data
US 2010/0209220 A1 Aug. 19, 2010

Related U.S. Application Data

(60) Provisional application No. 61/208,025, filed on Feb. 18, 2009.

(51) Int. Cl.
*G06F 19/00* (2006.01)
*B65G 1/04* (2006.01)

(52) U.S. Cl.
USPC ............... 700/1; 414/222; 414/331; 414/411; 414/416; 356/237.4

(58) Field of Classification Search ............. 414/222.02, 414/222, 331, 411, 416, 786, 936; 700/245, 700/1; 33/1 PT; 901/27, 9, 46; 356/237.4; 451/5
See application file for complete search history.

(56) References Cited

U.S. PATENT DOCUMENTS

| | | | |
|---|---|---|---|
| 5,308,989 A * | 5/1994 | Brubaker | 250/441.11 |
| 5,822,389 A * | 10/1998 | Uzawa et al. | 378/34 |
| 2007/0077861 A1 * | 4/2007 | Chen | 451/5 |
| 2008/0308729 A1 * | 12/2008 | Kimba et al. | 250/307 |
| 2009/0015248 A1 * | 1/2009 | Moura et al. | 324/207.26 |
| 2009/0103079 A1 * | 4/2009 | Uto et al. | 356/237.4 |

* cited by examiner

*Primary Examiner* — Ronnie Mancho
(74) *Attorney, Agent, or Firm* — Klarquist Sparkman, LLP

(57) ABSTRACT

A rotary actuator position sensor comprises a target with a target surface coupled to a rotatable shaft and a sensor positioned to face the target surface. The target surface is configured to vary the distance between the target surface and the position sensor as the shaft is shifted from one rotational position to another. The sensor provides an analog output signal that corresponds to distance to the target and therefore to the rotational position of the shaft. A controller processes a signal corresponding to the sensor output signal to determine the rotational position. The controller can control the rotation of the shaft from one rotational position to another. The position sensor can be used in a wafer processing system with the controller also controlling movement of a wafer cassette holder into and out of wet tanks and between tanks. The controller can also control an optional agitator and front to back and back to front movement of the shaft.

20 Claims, 8 Drawing Sheets

ROTARY ACTUATOR POSITION SENSOR

CROSS REFERENCE TO RELATED APPLICATIONS(S)

This application claims the benefit of U.S. Provisional Patent Application No. 61/208,025, filed Feb. 18, 2009.

TECHNICAL FIELD

A shaft rotary actuator position sensor in accordance with this disclosure is operable to sense and desirably control the rotary position of a shaft and is desirably used, in one example, in wet process equipment to move wafer cassettes from one tank to another.

BACKGROUND

Typically some tanks in a wet process system contain chemicals for treating wafers carried by a wafer cassette while some tanks contain deionized (DI) water for rinsing wafers. The chemical containing tanks generally clean, etch or strip elements from wafers carried by the cassettes when the cassettes are lowered into the chemical bath. The DI water rinse tanks are typically used to rinse off the chemical residue after the wafers have been cleaned, etched or stripped.

SUMMARY

Figure 1:
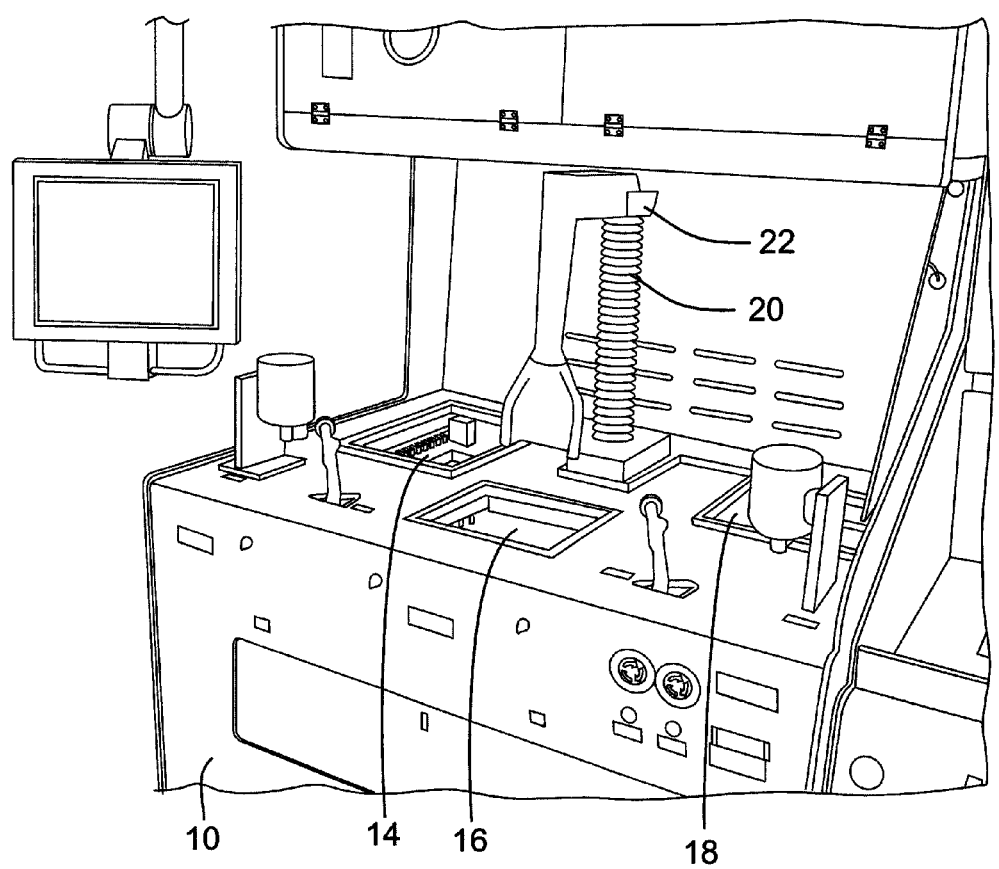
FIG. 1 is a perspective view of a wet treatment station comprising a pneumatic robot rotary actuator position sensor in accordance with one embodiment.

In accordance with one embodiment, a wafer treatment apparatus comprises: a plurality of upwardly opening tanks; a robot operable to move a wafer cassette from one tank to another tank; the robot comprising a first support, a carriage slidably mounted to the first support for upward and downward motion, an upright shaft rotatably coupled to the carriage for pivoting about the longitudinal axis of the shaft and relative to the carriage between plural positions, the shaft being supported by the carriage for upward and downward movement with the upward and downward motion of the carriage, a shaft elevator coupled to the carriage and operable to raise and lower the carriage to thereby raise and lower the shaft, a shaft rotator coupled to the shaft and operable to pivot the shaft from one position to another position, a cassette support arm coupled to an upper end portion of the shaft and a wafer cassette holder carried by the cassette support arm and projecting downwardly from the wafer cassette arm at a location spaced from the shaft; the robot also comprising a shaft position sensor comprising a target with a target surface mounted to the shaft and a sensor spaced from the target and operable to provide at least one analog output signal corresponding the distance from the target surface to the sensor, the target being configured to vary the distance from the target surface to the sensor depending upon the rotational position of the shaft such that the at least one analog output signal also corresponds to the rotational position of the shaft; a controller comprising a first input coupled to the analog sensor for receiving a signal corresponding to the at least one analog output signal and a command input for receiving a command signal indicating a rotational position to which the shaft is to be moved, the controller being coupled to the shaft elevator so as to cause the shaft elevator to move the carriage upwardly to raise the shaft, the cassette support arm and cassette holder upwardly to lift a cassette supported by the cassette holder upwardly to a position above a first of said tanks from which the cassette holder can be pivoted from a first location above the first tank to the rotational position indicated by the command signal, the shaft rotator being responsive to a signal corresponding to the command signal to pivot the shaft to the rotational position indicated by the command signal, wherein if the rotational position indicated by the command signal is above a second tank into which the cassette is to be immersed to treat wafers supported by the cassette holder, the controller is operable to control the shaft elevator to lower the carriage such that a cassette supported by the cassette holder is lowered into the second tank.

As a further aspect of an embodiment, the target surface can comprise an arcuate target surface coupled to the shaft. The arcuate target surface is desirably configured to continuously vary the distance between the target surface and sensor with the pivoting of the shaft such that there is a unique distance for each of the rotational positions to which the shaft can be rotated. Alternatively, the target can be configured to provide a unique signal for specific discrete rotational positions of the shaft. In one specific exemplary embodiment, the target is annular, the target surrounds the shaft and the target surface is also annular.

The robot can also comprise a front to back and back to front mover coupled to the first support and operational in response to a control signal from the controller to selectively move the first support and thereby the carriage and shaft to a front position or to a back position in response to the control signal.

As an additional aspect, the robot can optionally comprise an agitator coupled to the carriage and to the shaft and operable to move the shaft upwardly and downwardly relative to the carriage in response to agitation control signals from the controller to selectively reciprocate the shaft, the cassette support arm, cassette holder and a supported cassette upwardly and downwardly. The agitator can also be selectively operable in response to a control signal from the controller to shift to an upward position to provide additional clearance between a supported cassette holder and a tank at least as the shaft is rotated from one position to another position.

As a still further aspect of an embodiment, the shaft rotator can comprise a motor supported by the carriage and drivenly coupled to the shaft, such as by pulleys and a belt, and operable to selectively pivot the shaft to move the shaft between shaft rotational positions. In a specific example, the motor can comprise a DC motor having a drive input and operable to pivot the shaft in a first direction in response to the application of a DC drive voltage of a first polarity to the drive input and to pivot the shaft in a second direction in response to the application of a DC drive voltage of a second polarity opposite to the first polarity to the drive input, the DC motor maintaining the shaft in a position to which it has been pivoted in response to the application of an AC voltage to the drive input.

A control circuit can comprise a comparator amplifier (e.g. an amplifier with comparator inputs or a comparator in combination with an amplifier) having first and second inputs and a motor drive output coupled to the drive input, wherein the sensor provides first and second of said analog output signals, a signal corresponding to the first analog output signal (the corresponding signal can be the first analog output signal or, for example, a conditioned or processed version of this signal) being provided to the first input of the controller and a signal corresponding to the second analog output signal being provided to the first input of the comparator amplifier, an analog command signal corresponding to the rotational position indicated by the command signal being coupled from the controller to the second input of the comparator amplifier, the motor being operated by a DC drive voltage applied from the motor drive output to the drive input to pivot the shaft in the desired direction when a difference exists between the magnitudes of signals at the first and second inputs to the comparator and being provided with an AC voltage from the motor drive output to the drive input when the magnitudes of the signals at the first and second inputs to the comparator match one another.

As another aspect of this disclosure, a rotary actuator position sensor, that can be used in a wafer processing system or otherwise, that in one embodiment comprises a shaft supported for pivoting movement between a plurality of positions and a shaft position sensor comprising a target with a target surface mounted to the shaft and a sensor spaced from the target and operable to provide at least one analog output signal corresponding the distance from the target surface to the sensor, the target being configured to vary the distance from the target surface to the sensor depending upon the rotational position of the shaft such that the at least one analog output signal also corresponds to the rotational position of the shaft. The target can vary the distance by providing discrete different distances for selected rotational positions of the shaft. The position sensor can be used together with a shaft rotator coupled to the shaft and operable to pivot the shaft from one position to another position, a controller comprising a first input coupled to the analog sensor for receiving a signal corresponding to the at least one analog output signal and a command input for receiving a command signal indicating a rotational position to which the shaft is to be moved, the shaft rotator being responsive to a signal corresponding to the command signal to pivot the shaft to the rotational position indicated by the command signal. The target surface can, for example, comprise an arcuate target surface coupled to the shaft. The target surface can be configured in one embodiment to continuously vary the distance between the target surface and sensor with the pivoting of the shaft such that there is a unique distance for each of the rotational positions to which the shaft can be rotated. In one exemplary form, the target is annular and surrounds the shaft and wherein the target surface is also annular.

The position sensor can be used with a shaft rotator that comprises a motor that is drivenly coupled to the shaft and operable to selectively pivot the shaft to move the shaft between shaft rotational positions. In one specific example, the shaft rotator comprises a DC motor drivenly coupled to the shaft and operable to selectively pivot the shaft to move the shaft between shaft rotational positions, the DC motor having a drive input and being operable to pivot the shaft in a first direction in response to the application of a DC drive voltage of a first polarity to the drive input and to pivot the shaft in a second direction in response to the application of a DC drive voltage of a second polarity opposite to the first polarity to the drive input, the DC motor maintaining the shaft in a position to which it has been pivoted in response to the application of an AC voltage to the drive input. The position sensor can also be used with a control circuit that can comprise a comparator amplifier having first and second inputs and a motor drive output coupled to the drive input, wherein the sensor provides first and second of said analog output signals, a signal corresponding to the first analog output signal being provided to the first input of the controller and a signal corresponding to the second analog output signal being provided to the first input of the comparator amplifier, an analog command signal corresponding to the rotational position indicated by the command signal being coupled from the controller to the second input of the comparator amplifier, the motor being operated by a DC drive voltage applied from the motor drive output to the drive input to pivot the shaft in the desired direction when a difference exists between the magnitudes of signals at the first and second inputs to the comparator and being provided with an AC voltage from the motor drive output to the drive input when the magnitudes of the signals at the first and second inputs to the comparator match one another.

The invention is directed to all novel and non-obvious features and method acts set forth in this disclosure and is not limited to the illustrative examples set forth herein.

DETAILED DESCRIPTION OF EMBODIMENTS

One example of wet treatment station in which a rotary robot control system as described below can be installed is shown in FIG. 1. The FIG. 1 station comprises a cabinet 10 with a plurality of tanks 14, 16 and 18 within which chemical solutions, treatment materials and rinse materials, such as deionized water, can be included. An upright shaft 20, surrounded by a protective sleeve or boot, is shown ascending upwardly from a lower portion of the cabinet to a position at which the upper end of the shaft is positioned above the tanks. A wafer cassette supporting assembly (not clearly visible in FIG. 1, but designated generally by the number 22) is supported by the shaft. The shaft comprises a portion of a robot that, in this example, has two axes of movement. One axis of movement is vertical (the shaft being raised and lowered) to lift the cassettes and thereby wafers up out of, or lower the cassettes and wafers down into, the tanks for processing. The second axis of movement is an axis of rotation, such as about the longitudinal center line of the shaft 20. An arm or extension is coupled to an upper end portion of the shaft for rotational movement with the movement of the shaft. A wafer cassette holder is supported by the distal end of the arm spaced from the shaft. Rotation of the shaft thereby rotates the cassette holder and supported cassette holder and cassettes from one position to another (such as to a position above one tank to a position above another tank). The magnitude of the arc of rotation or motion of the cassette holder and the distance through which the cassette holder travels along the arc can be varied depending on factors such as the size of the tanks, the size of the wafers being processed, the dimensions of the cassettes, and the like, so that the cassettes are moved to the desired positions over respective tanks so that they can be lowered into the next tank in a treatment process.

Figure 2:
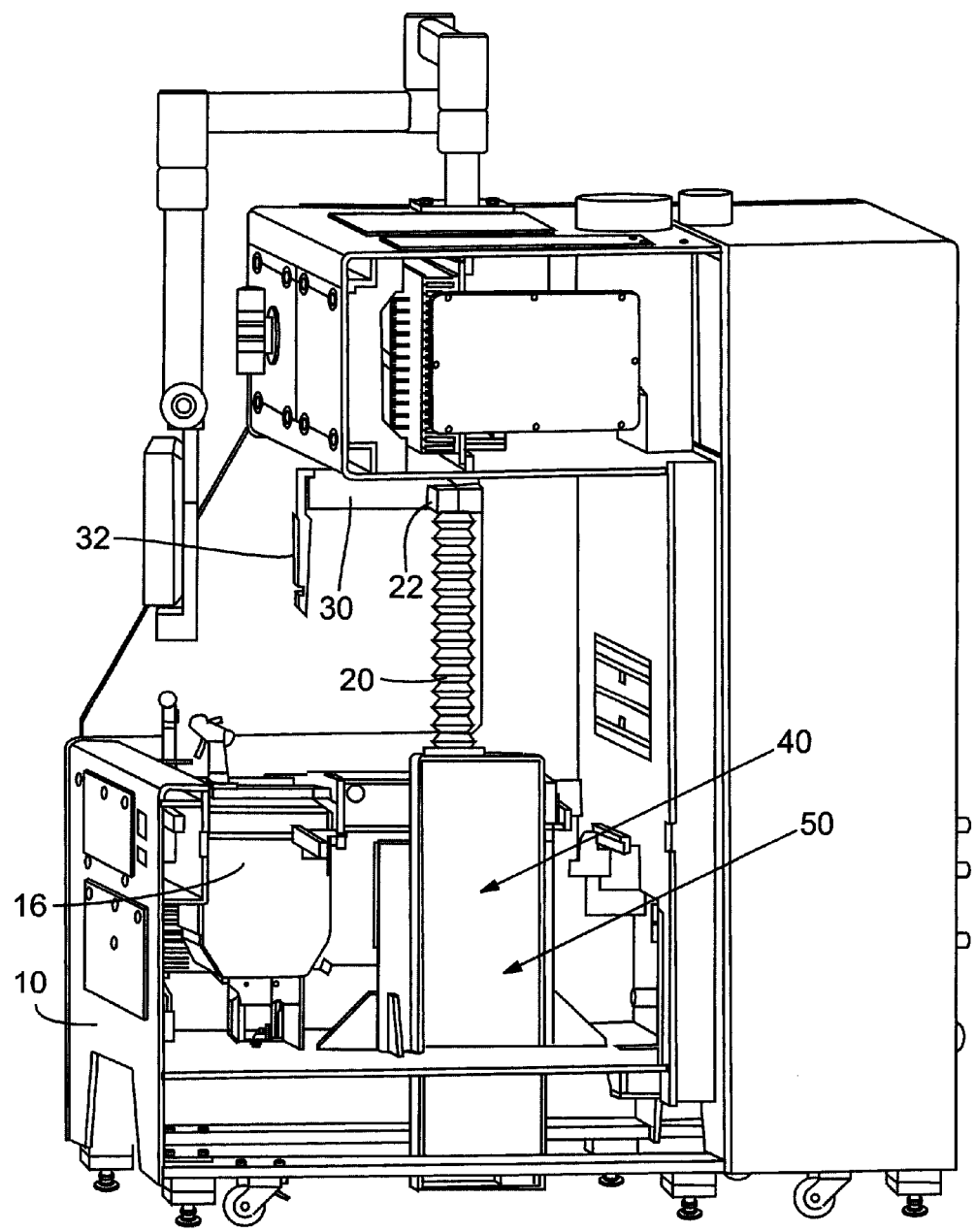
FIG. 2 is a partially broken away view of the wet station of FIG. 1.

FIG. 2 illustrates a wet station of the type shown in FIG. 1, with FIG. 2 being partially broken away for convenience in explaining the system. The boot enclosed shaft is indicated at 20 in FIG. 2. The wafer handling assembly 22 is shown with an arm 30 coupled to the upper end of the shaft 20. A cassette holder 32 is shown suspended downwardly from the distal end of the arm 30 spaced from the shaft 20. The cassette holder is shown in a position above tank 16 such that shaft 20 can be lowered to position a cassette when on the holder, and wafers contained therein, in the tank 16 and raised to lift the wafers out of the tank. In FIG. 2, the number 40 generally refers to the robot that includes the shaft 20. A housing 50 is also indicated in FIG. 2. Housing 50 contains a portion of the robot utilized for raising and lowering the shaft 20 as well as for rotating the shaft. In accordance with the disclosure below, a novel and unique robot system comprising pneumatic and hydraulic components is utilized for controlling the motion of the shaft.

One embodiment of the shaft motion controller portions of the robot is illustrated in FIGS. 3-6. With reference to these figures, a lower end portion of the shaft 20 is supported by a carriage 60 that is slidably coupled to and engaged by a rail 62 for upward and downward movement along the rail. The shaft moves upwardly and downwardly with the movement of the carriage. A shaft elevation adjuster is provided to raise and lower the shaft. A screw jack, hydraulic cylinder or other form of elevation adjuster can be used. In one desirable form, the elevation adjuster comprises a cylinder such as a pneumatic cylinder that can be positioned within the rail, a portion of which is indicated at 55 in the partially broken away portions of FIG. 4 and coupled to the carriage 60 such that extension of a piston of the cylinder raises the carriage and shaft. Correspondingly, retraction of the piston in the cylinder lowers the shaft. The flow of pressurized air from a source to the cylinder is controlled by a solenoid controlled valve 64 operated in response to control signals as desired. As the pneumatic piston extends to raise the shaft, an exhaust side chamber in the cylinder, opposite to an air source side chamber receiving air to extend the piston, can be sealed so that resistance to movement of the piston is provided. A pressure regulated valve can be used to limit this resistance pressure. A bleed valve can be opened to exhaust air from the source side chamber of the cylinder to allow the shaft to lower under the influence of gravity. Air can be allowed to enter the chamber at the exhaust side of the piston under these conditions. Alternatively, a dual action air cylinder can be used with pressurized air being supplied to one side of the piston within the cylinder to extend the piston and raise the shaft, and pressurized air being supplied to the opposite side of the piston to lower the shaft. For purposes of convenience, pneumatic and hydraulic tubing used in the embodiment of these figures has been omitted.

Optional redundant position confirmation sensors can be utilized to confirm the position of the piston and thereby the position of the shaft 20. These sensors can be built into various positions along the rail for this purpose.

An air cushion can be provided at opposite ends of travel of the piston by controlling the extent to which air is allowed to escape as the piston approaches the ends of its range of travel.

Figure 3:
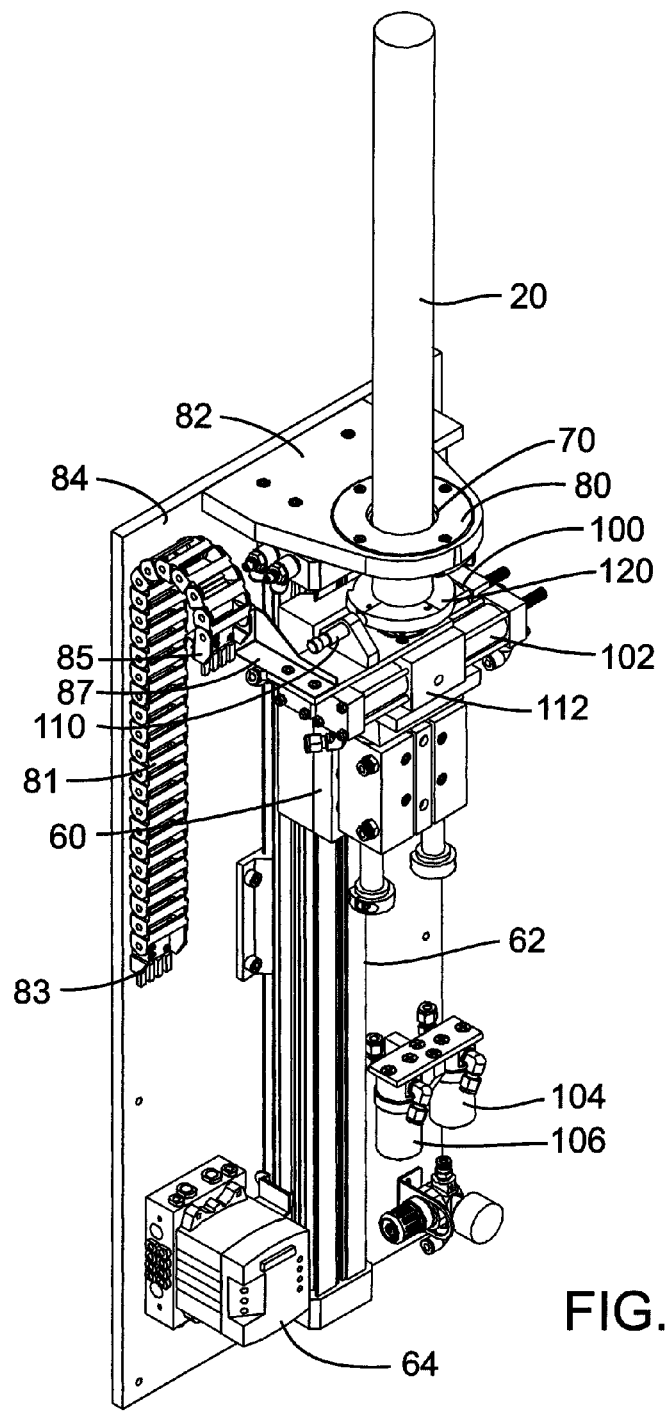
FIG. 3 is a perspective view of an embodiment of a shaft motion controller portion of a robot usable in the embodiment of FIG. 1.

As can be seen from FIG. 3, the shaft 20 extends upwardly from the support 60 through an opening 70 surrounded by a collar 80. Collar 80 can be supported by a bracket such as a plate 82 mounted to an interior surface of a support such as a wall 84 that forms a part of the housing 50 (FIG. 2). Electrical connections can be made to components on the carriage, for example, via a link type connector 81 having one end portion mounted to wall 84 and the other end portion 85 mounted to a carriage supported bracket 87. End portion 85 travels upwardly and downwardly with the carriage.

A shaft rotator is provided to pivot the shaft about the longitudinal axes of the shaft to a desired rotational position, for example to position a wafer carrying cassette above a chemical tank. One form of shaft rotation comprises first and second hydraulic cylinders 100, 102 (FIG. 3), each containing a hydraulic piston or actuator, that are supported by carriage 60 with the actuators being coupled to the shaft. Movement of actuator 100 in a first direction causes rotation of the shaft 20 about its longitudinal axis in a first direction. A rack and pinion mechanism is one example of a coupling mechanism for coupling the hydraulic pistons to the shaft. Movement of the actuator of cylinder 100 in the opposite direction causes an opposite rotational movement of the shaft. In addition, movement of the actuator within cylinder 102 in one direction opposite to the first direction rotates the shaft in the first direction whereas movement of the actuator within cylinder 102 in the opposite direction causes the opposite rotational movement of the shaft. Another example of a shaft rotator is a motor that is drivenly coupled to the shaft, such as in an example described below.

In operation, to move the shaft in one direction, hydraulic fluid is applied to the actuator of both of the cylinders to cause the desired movement. At the same time, hydraulic fluid flow is allowed to flow to the opposite end of said one cylinder in a manner that provides back pressure as resistance to the movement. To move the shaft in the opposite direction, the opposite flow of hydraulic fluid is controlled with back pressure again being provided to resist the rotation of the shaft. This approach results in control over the shaft movement so that smooth starting and stopping operation of the rotational motion is enhanced. First and second analog controlled, hydraulic proportioning valves 104, 106 are provided. These valves are coupled to a hydraulic reservoir 108 (see FIG. 4). Proportional valves are commercially available and can comprise solenoid actuated valves operable such that the flow rate of fluid through the valves is proportional to the solenoid current provided to the valves. Fine control of this current can be achieved using a commercially available amplifier. One of the valves 104, 106 is utilized for supplying fluid for movement of the actuators in the direction that causes the appropriate rotational movement of the shaft. The other proportional valve is coupled to the cylinders for providing back pressure to resist the shaft movement. As an alternative approach, back pressure can comprise pneumatic back pressure. Utilizing this analog speed control, extremely smooth operation of the shaft, including when the shaft rotation starts and stops, can be achieved. Also, the shaft can be stopped at positions that are adjustable based on the analog control input.

Figure 6:
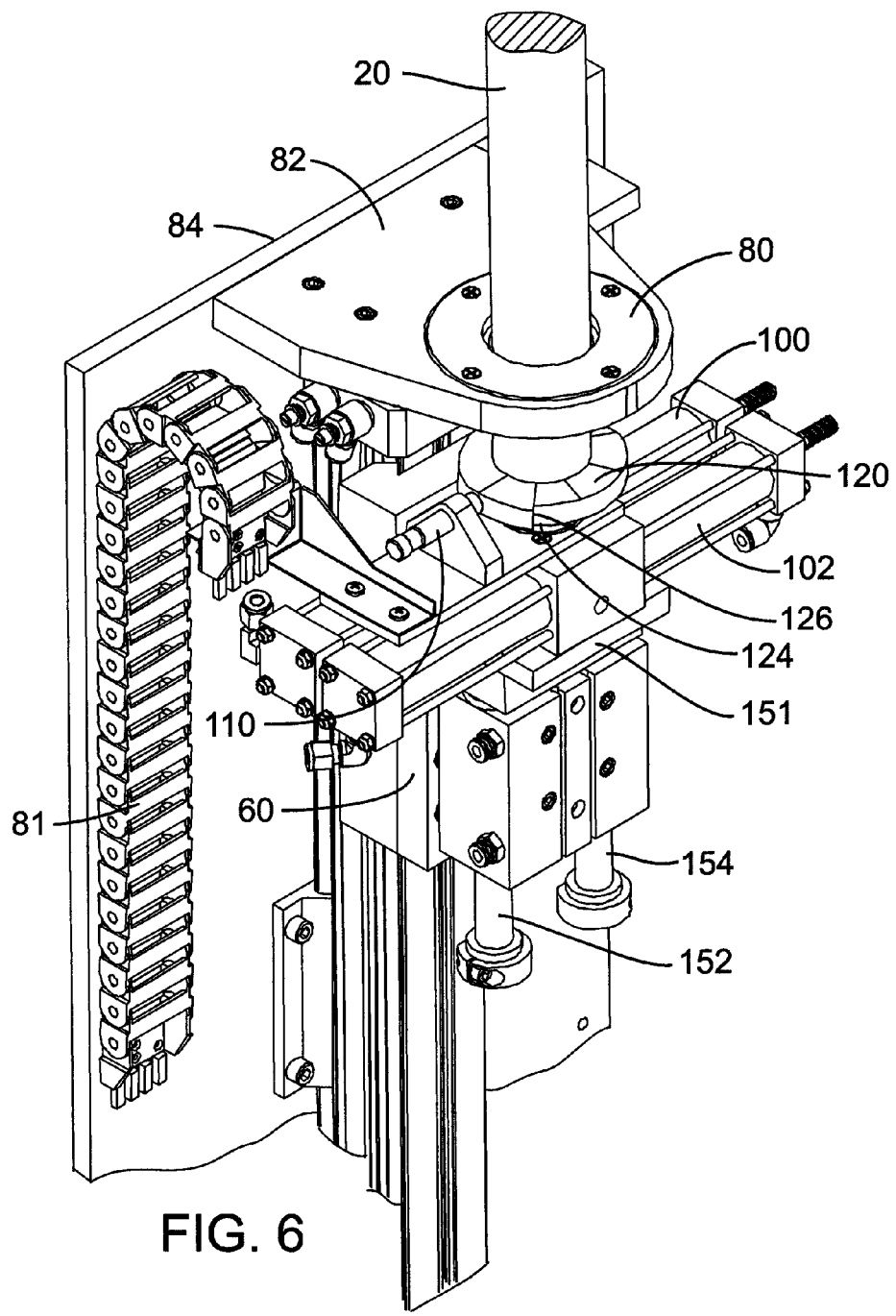
FIG. 6 is an enlarged view of a portion of the shaft motion controller of FIG. 3.

The rotational position of the shaft is desirably sensed to provide a position feedback signal for use in controlling the supply of hydraulic fluid to the cylinders 100, 102 to thereby start and stop the rotation of the shaft at the desired location. A particularly desirable sensor is an analog proximity sensor 110 operable to output an electrical signal that varies proportionately to the position of a metal target within the sensing range of the proximity sensor. A specific example of a suitable pneumatic sensor is a model AM9-10-1H position sensor from Automation Direct that provides both an analog current output signal and an analog voltage output signal that indicates the distance to the target. The proximity sensor 110 can be supported by a support, such as a plate 112 coupled to the carriage 60. In this disclosure, the term coupled or couple to encompasses the direct connection of elements to one another as well as indirect connection of elements through one or more elements. The target in this illustrated sensing approach comprises a cam 120 which, in one form, is annular and is mounted to the shaft so as to surround or substantially surround the shaft. An arcuate target that partially surrounds the shaft is another example, such as in cases where the desired rotational shaft positions differ from one another by an amount that is less than or equal to the arc encompassed by the arcuate target. A gap is provided between the outer edge or peripheral surface of the cam and the end of the proximity sensor so that desirably a zero contact (no contact between the cam and sensor) analog position sensing is achieved. The gap between the sensor and target is controlled in this example by varying the radius of the periphery of the cam at the location of the sensor with changes in the rotational positioning of the shaft (from the longitudinal center line of the shaft to the cam periphery adjacent to the sensor). As can be seen in FIG. 6, the periphery of the cam 120 has a contour that varies the gap depending on the relative position of the sensor 110 and the cam. In FIG. 6, the illustrated cam has a periphery with a radius from the center line of the shaft that is continuously decreased (thereby increasing the gap between the sensor and the periphery) moving in a clockwise direction from the position of the sensor shown in FIG. 6. In the specifically illustrated form, the cam periphery has its largest radius at a location 124 and then steps down to its smallest radius location indicated by the number 126. With this construction, as a shaft is rotated, the shaft position is precisely determined by the proximity sensor. For example, the position of the shaft can be sensed to within one-third of a degree or less. Other cam configurations can be used, such as a configuration with specific discrete gaps at desired rotary positions of the shaft, although this is less desirable.

Thus, the cam comprises an exemplary precision component used to provide a varying gap between the proximity sensor, which can be a capacitive sensor, and the periphery or cam disc outer edge surface. In one desirable application, the cam provides position sensing along a 280 degree arc of rotation of the shaft 20. However, depending upon the number of tanks and positions of the tanks in the wet station, greater or lesser ranges of motion can be used. The proximity sensor in this example is at a fixed position with variations in the gap being achieved by rotation of the shaft to thereby position a different portion of the cam adjacent to the position sensor. The proportional valves as described above allow the control of the speed of the movement of the shaft for smooth starts and stops at any given location to thereby provide flexibility in operation of the system.

Sensors optionally can be used to confirm the position of the shaft relative to the tanks. For example, one or more optical transmitter and receiver devices can be positioned about the shaft at locations corresponding to the center (or other position) of a tank.

Figure 5:
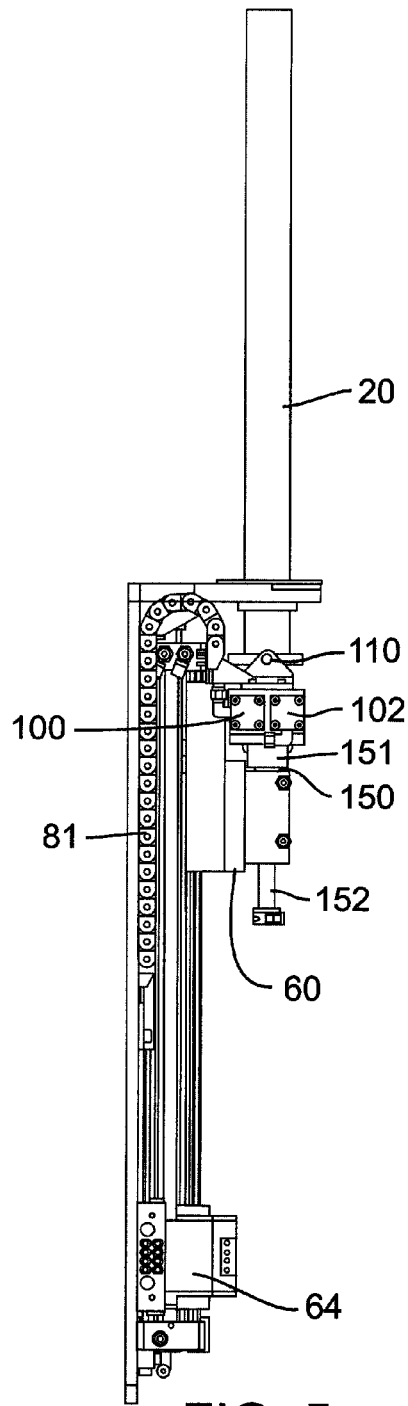
FIG. 5 is a side view of the motion controller embodiment of FIG. 3.
Figure 4:
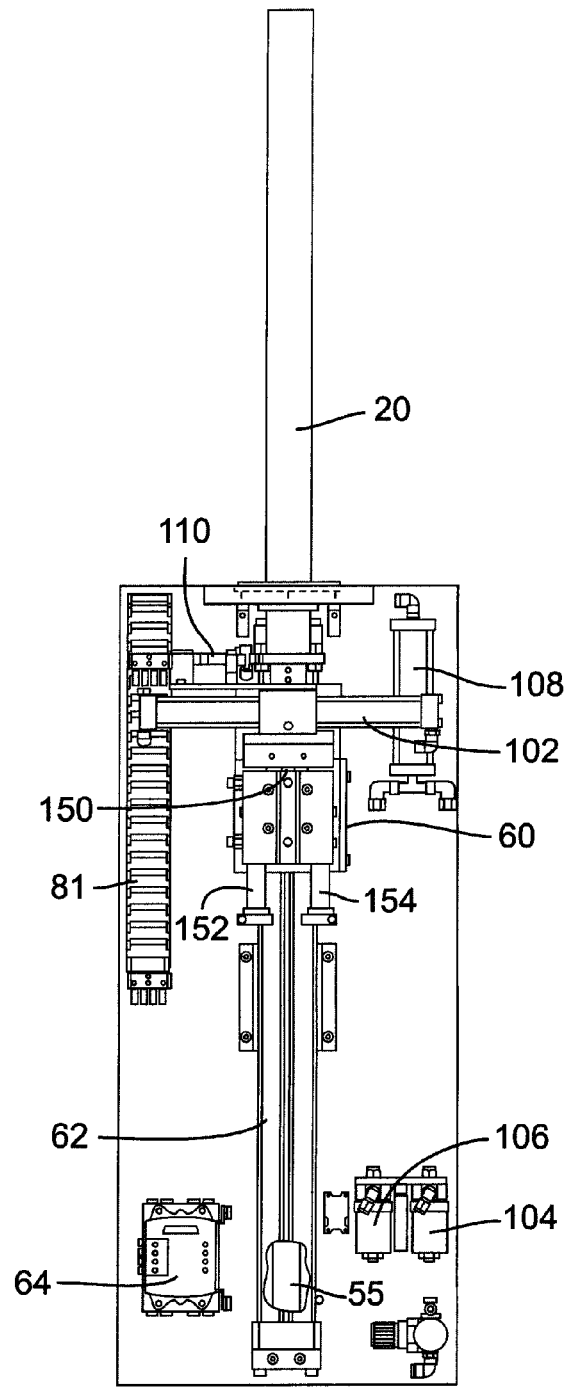
FIG. 4 is a front view of the shaft motion controller of FIG. 3.

With reference to FIGS. 4 and 5, the position sensor 110 and shaft rotator, in this example the cylinders 100, 102, can be supported for movement relative to the carriage 60, such as on a support 151 that is movable relative to the carriage. To guide this motion, a guiding apparatus is desirable provided. In one exemplary form, first and second guide sleeves or tubes 152, 154 are mounted to the carriage with longitudinal axes that are each positioned in vertical orientation. Guide pins or rods projecting downwardly from support 151 extend into the respective sleeves 152, 154. An agitating actuator capable of raising and lowering the platform 150 and thereby the shaft for a small distance is provided in this example. The agitating apparatus can be eliminated if agitation is not desired. As a specific example, a cylinder such as a pneumatic cylinder 150 having a short stroke, for example 3 inches, is coupled to carriage 60 and the platform 151 such that extension and retraction of a piston rod of the cylinder raises and lowers the shaft 20 repeatedly through small reciprocal movements. When a cassette is positioned in a tank of treatment liquid, the agitation actuator can be activated to cause raising and lowering of the cassette for this small distance to agitate the liquid and bathe the cassette as it is being treated. As can be seen in FIG. 6, a gap exists between the undersurface of support 82 and the top surface of the illustrated target or cam 120 to accommodate this agitation motion. Other forms of agitators can be used.

Figure 7:
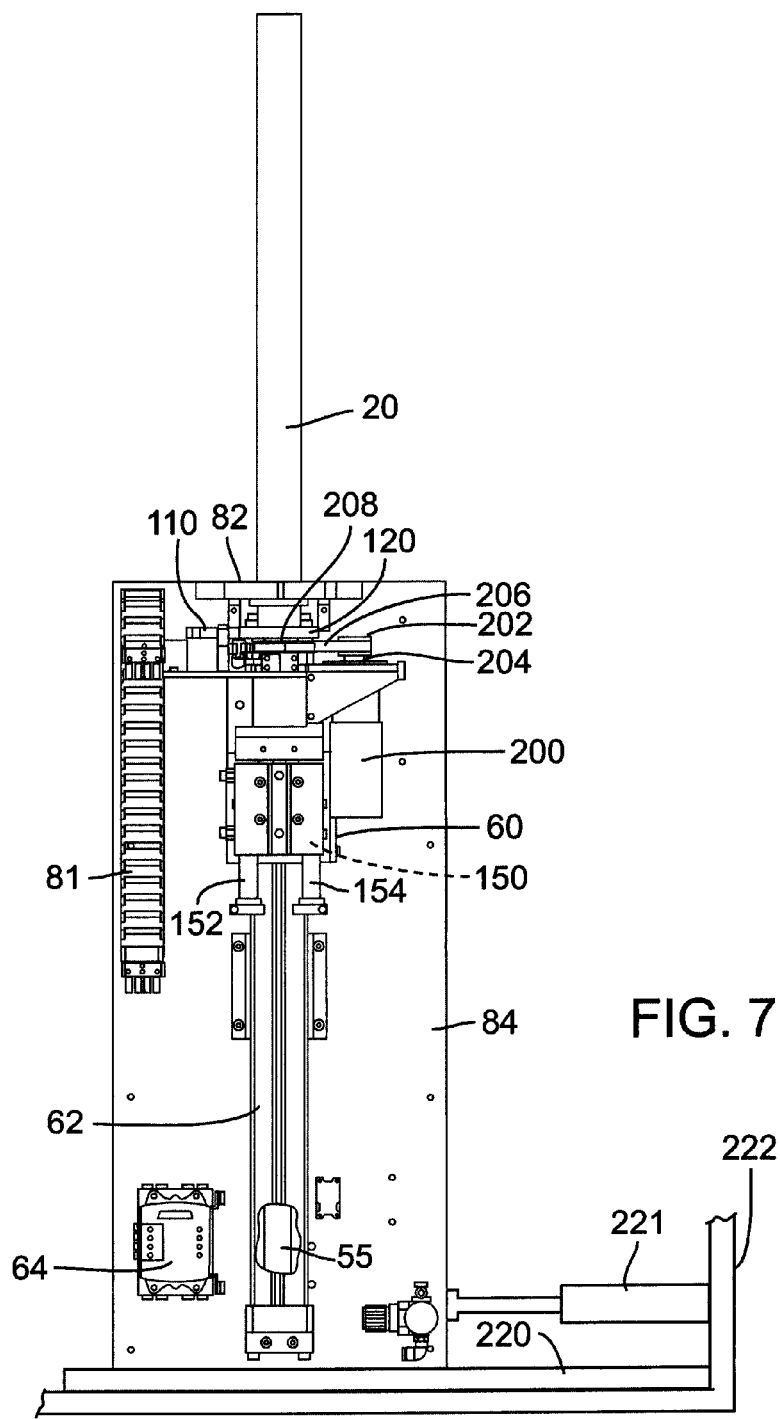
FIG. 7 is a front view of a shaft motion controller similar to FIG. 4, except utilizing a motor and belt drive apparatus for rotating the shaft from one position to another.

In the embodiment of FIG. 7, elements like those in the embodiment of FIG. 4 have been assigned the same numbers for convenience and will not be discussed further. In the FIG. 7 embodiment, instead of hydraulic actuators as the shaft rotator, a motor 200, such as a DC motor, is coupled to the shaft for selective rotation of the shaft to a desired position. A drive pulley 202 is mounted to a shaft 204 driven by motor 200. The pulley 202 is coupled by a drive belt 206 to a pulley 208 that surrounds and is coupled to or mounted to the shaft 200. The pulleys 206 and 208 may comprises toothed pulleys with belt engaging teeth that engage teeth receiving recesses about the interior perimeter of belt 206. Other drive belts, such as V belts, can be used.

As explained below, position sensor 110 cooperates with the illustrated cam target 120 to provide a signal that precisely indicates the rotary position of the shaft, as explained more fully below. In the embodiment of FIG. 7, like the embodiment of FIG. 3, an elevation adjuster, such as pneumatic cylinder coupled to carriage 60, raises and lowers the carriage to thereby raise and lower the shaft 20 and a cassette holder carried by the shaft. For example, when raised, the cassette holder is removed from an associated treatment tank. In addition, an agitator such as an agitation cylinder 150 can be included to repetitively raise and lower the shaft 20 relative to the carriage through small strokes, for example, so that a cassette carrier in a tank of treatment liquid is raised and lowered to thereby agitate the liquid to promote treatment of wafer on the cassette. Thus, agitator 150, which can comprise a pneumatic cylinder as previously explained, raises and lowers a platform carrying the motor, drive belt and position sensor, relative to the carriage 60 when the agitator is operated. As an optional feature, the robot housing comprising wall 84 can be mounted for sliding movement, such as linear sliding movement along a rail or a plurality of rails 220 in fore (front) and aft (bank) directions. A housing mover, such as cylinder 220 coupled to framework 222 of the wet treatment apparatus can be used to move the robot forwardly or backwardly as desired. This option can be employed, for example, if multiple rows of tanks (e.g. front tanks and rear tanks) are included in the wet process system. When a cassette is removed from a tank, for example a back tank, pneumatic cylinder 220 can be extended or activated to move the cassette to a position over a front tank. The combination of the housing mover 220 and shaft rotary positioner allows use of a plurality of front and back tanks as well as a plurality of tanks in a row.

Figure 8:
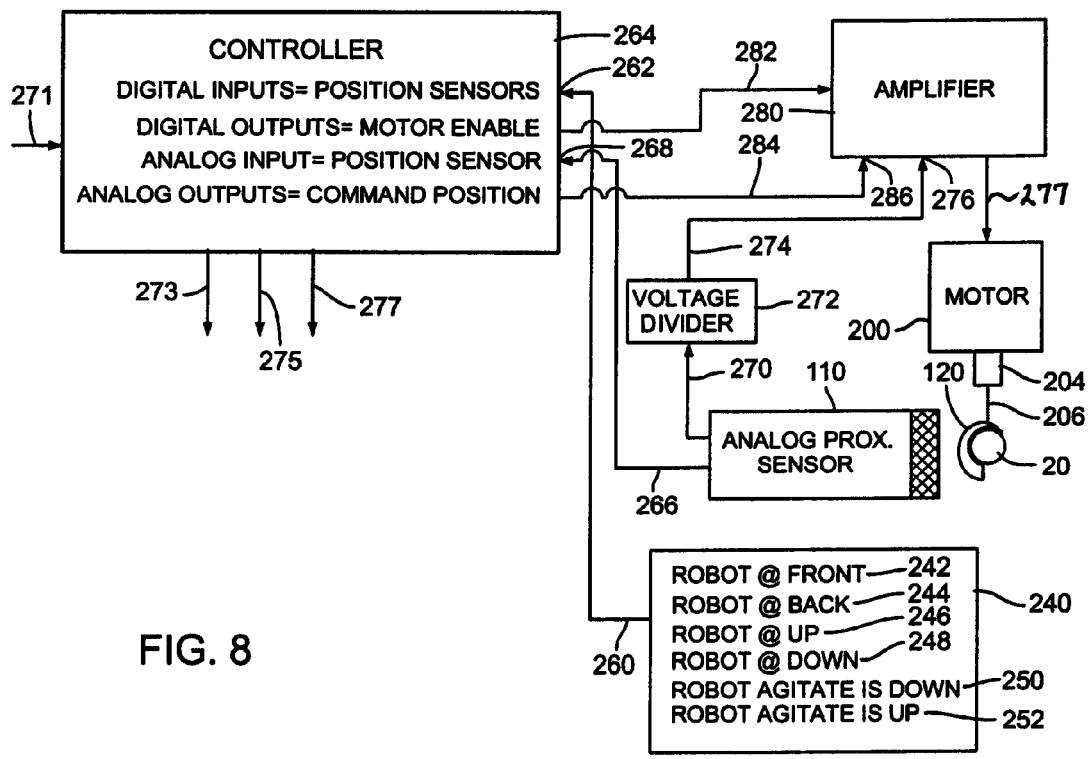
FIG. 8 is a schematic illustration of an exemplary circuit that can be used for controlling the drive motor of FIG. 7.

FIG. 8 illustrates an exemplary control circuit for the embodiment of FIG. 7. A similar control circuit can be used for the embodiment of FIG. 3 except that, instead of controlling a motor, hydraulic fluid is controlled to move the hydraulic cylinders 100, 102 as desired.

With reference to FIG. 8, a plurality of position sensors, indicated by the number 240, can be provided. These position sensors can be, for example, limit switches or digital position switches. In an embodiment where the optional fore and aft housing mover is provided (e.g. utilizing a mechanism such as cylinder 221 in FIG. 7) front and back position sensors 242, 244 are provided. In addition, robot up and down sensors 246, 248 are also provided in this example corresponding to the carriage being in its up or down position as controlled by cylinder 55 in the FIG. 7 example. In addition, sensors 250 and 252 are provided to indicate whether the agitator mechanism has raised or lowered the cassette (e.g. cylinder 150 in FIG. 7 is up (extended) or down (retracted)). The sensor position signals are delivered via a line or lines 260 to a sensor input or inputs 262 of a controller 264, such as a programmable logic controller. The position sensor 110 in the example of FIG. 8 provides a current analog output signal along a line 266 to a position sensor analog input 268 of the controller 264. In addition, sensor 110 provides a position indicating analog voltage output signal along a line 270 which, in one example, comprises a 0 to 10 volt DC signal with the magnitude of the signal corresponding to the rotary position of the shaft 120. For convenience and to condition this signal to an appropriate voltage level, the signal on line 270 is fed to a voltage divider 272 which provides an output on line 274 that varies from 0 to 5 volts DC and again corresponds to the rotary shaft position of shaft 20. The signal on line 274 is provided to an input 276 to an amplifier 280. Amplifier 280 can comprise a commercially available amplifier, such as a DC servo amplifier, with a model LS-5Y-DE amplifier from Logosol being one specific example. In response to a command signal, which may be, for example, automatically generated or manually generated (e.g. by actuating a switch) at an input 271, the controller 264 provides appropriate linear motion control signals. For example, if a wafer cassette is in a tank and it is desired to move the wafer cassette to another tank, a control signal on line 273 from the controller 264 causes cylinder 55 to extend and raise the cassette upwardly and out of the tank it is in. In addition, a control signal on line 275, if additional clearance is desired, can cause the agitation cylinder 150 to shift to its extended position (if not already extended) to further raise the cassette. If a front to back mover is provided, a control signal can be sent on line 277 to cause the desired front or back movement of the housing (e.g. by controlling cylinder 221 in FIG. 7). In addition, a motor enable signal is delivered via line 282 to the amplifier to 280 to cause the motor 200 to be enabled for rotational movement of the shaft 20 in the proper direction from the shafts then current position, as determined from the input at 268, to the commanded position. In addition, an analog voltage output signal is provided along line 284 to the amplifier. The signal on line 284 in this example ranges from 0 to 5 volts with the magnitude corresponding to the position commanded by input 271. Amplifier 220 comprises a comparator operable to compares the voltage from line 284 at input 286 with the voltage on line 274 at input 276. When they match, the shaft has been rotated to the proper position. Amplifier 280 also is coupled to an AC input power signal (such as to a 120 volts AC power source). In an example where motor 200 is a DC motor, when the inputs at 276 and 286 match, an AC signal can be coupled to motor 200 (e.g. from a motor drive output of the amplifier 277 via a line 277 to a drive input to the motor) so that the motor does not move and it remains in equilibrium at the desired next position. If the rotary position of the shaft were to deviate from the desired position, this deviation is indicated by the input signal at 268, which results in the controller causing the delivery of a drive signal from the motor drive output of the amplifier via line 277 to the drive input of the motor to drive the motor to move the shaft in the appropriate direction. Alternatively, analog current control signals can be used instead of analog voltage control signals. Using analog signals is desirable in these embodiments for relatively inexpensive and precision control of the shaft rotational position.

With the above approach, whenever the apparatus is powered up, the rotary position of the shaft and the linear position of the linear movers is known. Consequently, there is no need to return the system to a home position to recommence wafer processing.

Figure 9:
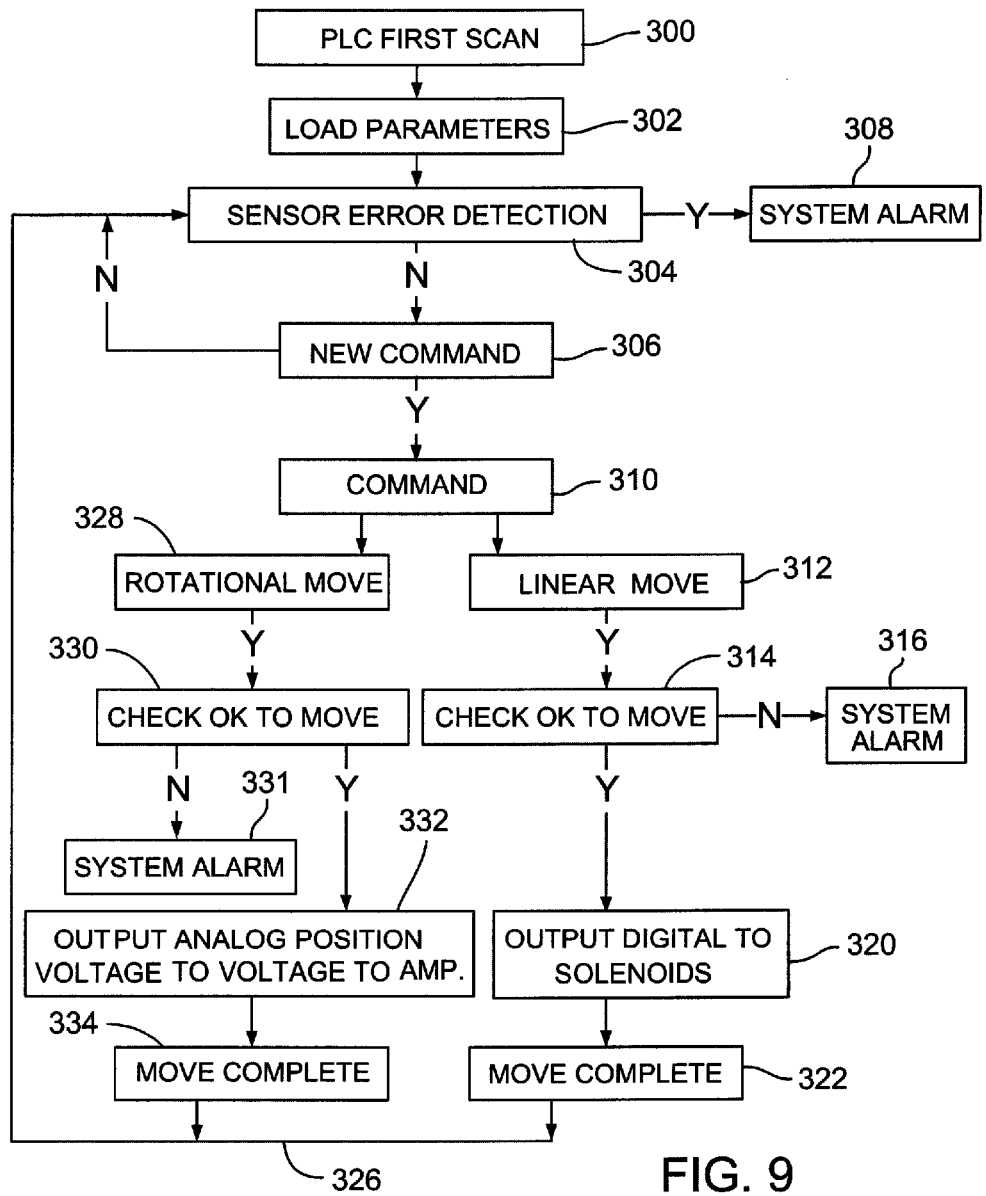
FIG. 9 is an exemplary flow diagram for a program that can be used to sense and control the position of a shaft.

An exemplary program for the programmable logic controller 264 is shown in FIG. 9. Again, this is only an example, as alternative approaches can be used. In FIG. 9 at block 300, the position of the linear movers and rotary shaft is obtained by scanning. At block 302 the initial parameters for the wet process system are entered. For example, parameters can be entered to indicate the position of the various tanks and the sequence from tank to tank to be followed during processing. Blocks 304 and 306 are in essence a home position. At block 304 the system is monitored for possible errors (e.g. a failure of a sensor). In the event of an error, a system alarm at block 308 is activated. At block 306 a determination is made as to whether a new command (e.g. via input 271 of FIG. 8) has been received. If the answer is no, the no branch from block 306 is followed back to block 304 and process continues until such time as a new command is received.

At block 310, a determination is made that a new command has been received. The programmable logic controller then checks to see whether linear movement is required at block 312. Linear movement can comprise agitation (e.g. by cylinder 150), raising of the shaft (e.g. by cylinder 55), and/or shifting of the housing to a front or rear position by cylinder 221. Before front to back shifting of the housing or rotary movement of the shaft, the linear movement at 312 involves raising the shaft so that the wafer cassette clears a tank (e.g. by fully extending the cylinder 55 and the cylinder 150 if needed). Front to back movement, if a front to back system is provided, can then be accomplished. Prior to linear movement, a check is made at block 314 as to whether the movement is appropriate. For example, front to back movement would not be appropriate if the wafer cassette is still in the tank.

In such a case, a system alarm at block 316 can be activated. If movement is appropriate, the controller provides appropriate outputs at 273, 275 and 277 to cause the desired movement in the desired sequence. For example, at block 320, these output signals can be fed to solenoid actuated valves to deliver pressure to pneumatic cylinders if such pneumatic cylinders are being used. At block 322, a determination is made as to whether the linear motion is complete and the process continues via line 326 to block 304. If the command also requires rotational movement, when block 310 is again reached, the process reaches block 328, at which the rotational movement command is performed. At block 330, a determination is made as to whether a rotational movement is appropriate. If not, a system alarm can be activated at block 331. For example, rotational movement would not be appropriate if a cassette is positioned in a tank and the rotational movement would cause the cassette to impact the walls of the tank. If rotational movement is appropriate, the rotational command signal is provided on line 284 which, in the illustrated example, can comprise an analog position voltage that is delivered to the amplifier 280. At block 334 a determination is made as to whether the rotational move is complete. If so, a line 326 is reached and the process continues back to block 304. The move can also include (and typically does include) linear motion to lower a wafer cassette into a tank after it is positioned above the tank.

It will be appreciated that some of these movements can be accomplished simultaneously and need not be performed sequentially. For example, after a wafer cassette has cleared a tank, front to back (or back to front) movement can be accomplished simultaneously with the rotary movement of a shaft. It should also be appreciated that the shaft rotating position sensor and control as parts of these embodiments are applicable to other than shaft rotary position control in a wafer treatment apparatus.

The embodiments described above are cost effective, highly reliable, and are relatively low maintenance. The embodiments are also ergonomic solutions for many applications.

Having illustrated and described the principles of our invention with respect to a desirable embodiment, it should be apparent to those of ordinary skill in the art that this embodiment can be modified in arrangement and detail without departing from the inventive principles disclosed herein. We claim as our invention all such modifications.

We claim:

1. A wafer treatment apparatus comprising:
   a plurality of upwardly opening tanks;
   a robot operable to move a wafer cassette from one tank to another tank;
   the robot comprising a first support, a carriage slidably mounted to the first support for upward and downward motion, an upright shaft rotatably coupled to the carriage for pivoting about a longitudinal axis of the shaft and relative to the carriage between plural positions, the shaft being supported by the carriage for upward and downward movement with the upward and downward motion of the carriage, a shaft elevator coupled to the carriage and operable to raise and lower the carriage to thereby raise and lower the shaft, a shaft rotator coupled to the shaft and operable to pivot the shaft from one position to another position, a cassette support arm coupled to an upper end portion of the shaft and a wafer cassette holder carried by the cassette support arm and projecting downwardly from the wafer cassette arm at a location spaced from the shaft;
   the robot also comprising a shaft position sensor, the shaft position sensor comprising a target with a target surface mounted to the shaft and a sensor spaced from the target surface and operable to provide at least one analog output signal corresponding to the distance from the target surface to the sensor, the target being configured to vary the distance from the target surface to the sensor depending upon the rotational position of the shaft such that the at least one analog output signal also corresponds to the rotational position of the shaft;
   a controller comprising a first input coupled to the sensor for receiving a signal corresponding to the at least one analog output signal and a command input for receiving a command signal indicating a rotational position to which the shaft is to be moved, the controller being coupled to the shaft elevator so as to cause the shaft elevator to move the carriage upwardly to raise the shaft upwardly, to raise the cassette support arm upwardly, and to raise the cassette holder upwardly to lift a cassette supported by the cassette holder upwardly to a position above a first of said tanks from which the cassette holder can be pivoted from a first location above the first tank to the rotational position indicated by the command signal, the shaft rotator being responsive to a signal corresponding to the command signal to pivot the shaft to the rotational position indicated by the command signal;
   wherein if the rotational position indicated by the command signal is above a second tank into which the cassette is to be immersed to treat wafers supported by the cassette holder, the controller is operable to control the shaft elevator to lower the carriage such that a cassette supported by the cassette holder is lowered into the second tank.

2. An apparatus according to claim 1 wherein the target surface comprises an arcuate target surface coupled to the shaft.

3. An apparatus according to claim 2 wherein the arcuate target surface is configured to continuously vary the distance between the target surface and sensor with the pivoting of the shaft such that there is a unique distance for each of the rotational positions to which the shaft can be rotated.

4. An apparatus according to claim 2 in which the target is annular and the target surface is also annular.

5. An apparatus according to claim 1 in which the robot further comprises a front to back and back to front mover coupled to the first support and operational in response to a control signal from the controller to selectively move the first support and thereby the carriage and shaft to a front position or to a back position in response to the control signal.

6. An apparatus according to claim 5 in which the robot further comprises an agitator coupled to the carriage and to the shaft and operable to move the shaft upwardly and downwardly relative to the carriage in response to agitation control signals from the controller to selectively reciprocate the shaft, the cassette support arm, cassette holder and a supported cassette upwardly and downwardly.

7. An apparatus according to claim 6 in which the agitator is selectively operable in response to a control signal from the controller to shift to an upward position to provide additional clearance between a supported cassette holder and a tank at least as the shaft is rotated from one position to another position.

8. An apparatus according to claim 1 wherein the shaft rotator comprises a motor supported by the carriage and drivenly coupled to the shaft and operable to selectively pivot the shaft to move the shaft between shaft rotational positions.

9. An apparatus according to claim 8 wherein the motor comprises a DC motor having a drive input and operable to pivot the shaft in a first direction in response to the application of a DC drive voltage of a first polarity to the drive input and to pivot the shaft in a second direction in response to the application of a DC drive voltage of a second polarity opposite to the first polarity to the drive input, the DC motor maintaining the shaft in a position to which it has been pivoted in response to the application of an AC voltage to the drive input.

10. An apparatus according to claim 9 comprising a comparator amplifier having first and second inputs and a motor drive output coupled to the drive input, wherein the sensor provides first and second of said analog output signals, a signal corresponding to the first analog output signal being provided to the first input of the controller and a signal corresponding to the second analog output signal being provided to the first input of the comparator amplifier, an analog command signal corresponding to the rotational position indicated by the command signal being coupled from the controller to the second input of the comparator amplifier, the motor being operated by a DC drive voltage applied from the motor drive output to the drive input to pivot the shaft in the desired direction when a difference exists between the magnitudes of signals at the first and second inputs to the comparator and being provided with an AC voltage from the motor drive output to the drive input when the magnitudes of the signals at the first and second inputs to the comparator match one another.

11. A rotary actuator position sensor comprising:
a shaft supported for pivoting movement between a plurality of positions; and
a shaft position sensor comprising a target with a target surface mounted to the shaft and a sensor spaced from the target surface and operable to provide at least one analog output signal corresponding the distance from the target surface to the sensor, the target being configured to vary the distance from the target surface to the sensor depending upon the rotational position of the shaft such that the at least one analog output signal also corresponds to the rotational position of the shaft.

12. An apparatus according to claim 11 further comprising a shaft rotator coupled to the shaft and operable to pivot the shaft from one position to another position, a controller comprising a first input coupled to the analog sensor for receiving a signal corresponding to the at least one analog output signal and a command input for receiving a command signal indicating a rotational position to which the shaft is to be moved, the shaft rotator being responsive to a signal corresponding to the command signal to pivot the shaft to the rotational position indicated by the command signal.

13. An apparatus according to claim 11 wherein the target surface comprises an arcuate target surface coupled to the shaft.

14. An apparatus according to claim 13 wherein the arcuate target surface is configured to continuously vary the distance between the target surface and sensor with the pivoting of the shaft such that there is a unique distance for each of the rotational positions to which the shaft can be rotated.

15. An apparatus according to claim 11 in which the target is annular and surrounds the shaft and wherein the target surface is also annular.

16. An apparatus according to claim 11 wherein the shaft rotator comprises a motor that is drivenly coupled to the shaft and operable to selectively pivot the shaft to move the shaft between shaft rotational positions.

17. An apparatus according to claim 12 wherein the shaft rotator comprises a DC motor drivenly coupled to the shaft and operable to selectively pivot the shaft to move the shaft between shaft rotational positions, the DC motor having a drive input and being operable to pivot the shaft in a first direction in response to the application of a DC drive voltage of a first polarity to the drive input and to pivot the shaft in a second direction in response to the application of a DC drive voltage of a second polarity opposite to the first polarity to the drive input, the DC motor maintaining the shaft in a position to which it has been pivoted in response to the application of an AC voltage to the drive input.

18. An apparatus according to claim 17 comprising a comparator amplifier having first and second inputs and a motor drive output coupled to the drive input, wherein the sensor provides first and second of said analog output signals, a signal corresponding to the first analog output signal being provided to the first input of the controller and a signal corresponding to the second analog output signal being provided to the first input of the comparator amplifier, an analog command signal corresponding to the rotational position indicated by the command signal being coupled from the controller to the second input of the comparator amplifier, the motor being operated by a DC drive voltage applied from the motor drive output to the drive input to pivot the shaft in the desired direction when a difference exists between the magnitudes of signals at the first and second inputs to the comparator and being provided with an AC voltage from the motor drive output to the drive input when the magnitudes of the signals at the first and second inputs to the comparator match one another.

19. A wafer treatment apparatus comprising:
a plurality of upwardly opening tanks;
a robot operable to move a wafer cassette from one tank to another tank;
the robot comprising a first support, a carriage slidably mounted to the first support for upward and downward motion, an upright shaft rotatably coupled to the carriage for pivoting about a longitudinal axis of the shaft and relative to the carriage between plural positions, the shaft being supported by the carriage for upward and downward movement with the upward and downward motion of the carriage, a shaft elevator coupled to the carriage and operable to raise and lower the carriage to thereby raise and lower the shaft, a shaft rotator coupled to the shaft and operable to pivot the shaft from one position to another position, a cassette support arm coupled to an upper end portion of the shaft and a wafer cassette holder carried by the cassette support arm and projecting downwardly from the wafer cassette arm at a location spaced from the shaft;
the robot also comprising a shaft position sensor, the shaft position sensor comprising a target with a target surface mounted to the shaft and an analog sensor spaced from the target surface and operable to provide at least one analog output signal corresponding to the distance from the target surface to the analog sensor, the target being configured to vary the distance from the target surface to the analog sensor depending upon the rotational position of the shaft such that the at least one analog output signal also corresponds to the rotational position of the shaft;
a controller comprising a first input coupled to the analog sensor for receiving a signal corresponding to the at least one analog output signal and a command input for receiving a command signal indicating a rotational position to which the shaft is to be moved, the controller being coupled to the shaft elevator so as to cause the shaft elevator to move the carriage upwardly to raise the shaft upwardly, to raise the cassette support arm upwardly, and to raise the cassette holder upwardly to lift a cassette supported by the cassette holder upwardly to a position above a first of said tanks from which the cassette holder can be pivoted from a first location above the first tank to the rotational position indicated by the command signal, the shaft rotator being responsive to a signal corresponding to the command signal to pivot the shaft to the rotational position indicated by the command signal;
wherein if the rotational position indicated by the command signal is above a second tank into which the cassette is to be immersed to treat wafers supported by the cassette holder, the controller is operable to control the shaft elevator to lower the carriage such that a cassette supported by the cassette holder is lowered into the second tank;
wherein the target is annular and surrounds the shaft and wherein the target surface is also annular, the target surface being configured to continuously vary the distance between the target surface and the analog sensor with the pivoting of the shaft such that there is a unique distance for each of the rotational positions to which the shaft can be rotated;
wherein the robot further comprises an agitator coupled to the carriage and to the shaft and operable to move the shaft upwardly and downwardly relative to the carriage in response to agitation control signals from the controller to selectively reciprocate the shaft, the cassette support arm, cassette holder and a supported cassette upwardly and downwardly, and wherein agitator is selectively operable in response to a control signal from the controller to shift the shaft to an upward position to provide additional clearance between a supported cassette holder and a tank at least as the shaft is rotated from one position to another position;

the shaft rotator comprising a motor supported by the carriage and drivenly coupled to the shaft and operable to selectively pivot the shaft to move the shaft between shaft rotational positions, wherein the motor comprises a DC motor having a drive input and being operable to pivot the shaft in a first direction in response to the application of a DC drive voltage of a first polarity to the drive input and to pivot the shaft in a second direction in response to the application of a DC drive voltage of a second polarity opposite to the first polarity to the drive input, the DC motor maintaining the shaft in a position to which it has been pivoted in response to the application of an AC voltage to the drive input; and a comparator amplifier having first and second inputs and a motor drive output coupled to the drive input, wherein the analog sensor provides first and second of said analog output signals, a signal corresponding to the first analog output signal being provided to the first input of the controller and a signal corresponding to the second analog output signal being provided to the first input of the comparator amplifier, an analog command signal corresponding to the rotational position indicated by the command signal being coupled from the controller to the second input of the comparator amplifier, the motor being operated by a DC drive voltage applied from the motor drive output to the drive input to pivot the shaft in the desired direction when a difference exists between the magnitudes of signals at the first and second inputs to the comparator and being provided with an AC voltage from the motor drive output to the drive input when the magnitudes of the signals at the first and second inputs to the comparator match one another.

20. An apparatus according to claim 19 wherein the robot further comprises a front to back and back to front mover coupled to the first support and operational in response to a control signal from the controller to selectively move the first support and thereby the carriage and shaft to a front position or to a back position in response to the control signal.

* * * * *

UNITED STATES PATENT AND TRADEMARK OFFICE
CERTIFICATE OF CORRECTION

PATENT NO. : 8,442,659 B2
APPLICATION NO. : 12/707591
DATED : May 14, 2013
INVENTOR(S) : Jeffrey M. Wagner and Daniel L. Schloesser It is certified that error appears in the above-identified patent and that said Letters Patent is hereby corrected as shown below:

In the Specification:

Column 2, lines 7-8, "corresponding the distance" should read -- corresponding to the distance --

Column 8, line 21, "may comprises" should read -- may comprise --

Column 9, line 50, "to compares the" should read -- to compare the --

In the Claims:

Claim 11, Column 13, line 7, "corresponding the distance" should read -- corresponding to the distance --

Signed and Sealed this
Eleventh Day of March, 2014

Michelle K. Lee
*Deputy Director of the United States Patent and Trademark Office*